(12) United States Patent (10) Patent No.: US 12,575,360 B2

Nguyen et al. (45) Date of Patent: Mar. 10, 2026

(54) SEMICONDUCTOR PROCESSING CHAMBER ADAPTER

(71) Applicant: Applied Materials, Inc., Santa Clara, CA (US)

(72) Inventors: Son T. Nguyen, San Jose, CA (US); Kenneth D. Schatz, Los Altos, CA (US); Anh N. Nguyen, Milpitas, CA (US); Soonwook Jung, Campbell, CA (US); Ryan Pakulski, Brentwood, CA (US); Anchuan Wang, San Jose, CA (US); Zihui Li, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 35 days.

(21) Appl. No.: 17/366,761

(22) Filed: Jul. 2, 2021

(65) Prior Publication Data

US 2023/0005765 A1 Jan. 5, 2023

(51) Int. Cl.
*H01L 21/67* (2006.01)
*H01J 37/32* (2006.01)

(52) U.S. Cl.
CPC .. *H01L 21/67069* (2013.01); *H01J 37/32082* (2013.01); *H01J 37/32357* (2013.01)

(58) Field of Classification Search
CPC .......... H01L 21/67069; H01J 37/32082; H01J 37/32357
See application file for complete search history.

(56) References Cited

U.S. PATENT DOCUMENTS 5,567,243 A * 10/1996 Foster
6,029,602 A * 2/2000 Bhatnagar ......... H01J 37/32247
118/723 MR (Continued)

FOREIGN PATENT DOCUMENTS

JP 2011035052 A 2/2011
JP 2014510390 A 4/2014

(Continued)

OTHER PUBLICATIONS

International Search Report and Written Opinion mailed on Oct. 12, 2022 in International Patent Application No. PCT/US2022/034059, 10 pages.

(Continued)

*Primary Examiner* — Parviz Hassanzadeh
*Assistant Examiner* — Margaret Klunk
(74) *Attorney, Agent, or Firm* — Kilpatrick Townsend & Stockton LLP

(57) ABSTRACT

Exemplary semiconductor processing systems may include a processing chamber. The systems may include a remote plasma unit coupled with the processing chamber. The systems may include an adapter coupled between the remote plasma unit and the processing chamber. The adapter may be characterized by a first end and a second end opposite the first end. The remote plasma unit may be coupled with the adapter at the first end. The adapter may define a first central channel extending more than 50% of a length of the adapter from the first end of the adapter. The adapter may define a second central channel extending less than 50% of the length of the adapter from the second end of the adapter. The adapter may define a transition between the first central channel and the second central channel.

20 Claims, 5 Drawing Sheets

(56) References Cited

U.S. PATENT DOCUMENTS

| | | | | |
|---|---|---|---|---|
| 6,387,207 | B1 * | 5/2002 | Janakiraman | H01J 37/32458 |
| | | | | 156/345.35 |
| 2004/0149224 | A1 | 8/2004 | Wang | |
| 2008/0044569 | A1 * | 2/2008 | Myo | C23C 16/40 |
| | | | | 427/248.1 |
| 2011/0114601 | A1 * | 5/2011 | Lubomirsky | H01J 37/32357 |
| | | | | 118/723 MP |
| 2011/0126405 | A1 * | 6/2011 | Baek | H01J 37/32174 |
| | | | | 156/345.34 |
| 2015/0013793 | A1 * | 1/2015 | Chuc | C23C 16/45565 |
| | | | | 137/561 A |
| 2015/0040829 | A1 * | 2/2015 | Ramaswamy | H01J 37/32596 |
| | | | | 118/723 E |
| 2017/0338134 | A1 * | 11/2017 | Tan | H01J 37/32816 |
| 2018/0337024 | A1 * | 11/2018 | Tan | H01L 21/3065 |
| 2019/0043726 | A1 | 2/2019 | Yang et al. | |
| 2019/0252216 | A1 * | 8/2019 | Samir | B01F 25/105 |
| 2019/0272998 | A1 | 9/2019 | Yang et al. | |
| 2020/0118845 | A1 | 4/2020 | Tan et al. | |

FOREIGN PATENT DOCUMENTS

| | | | |
|---|---|---|---|
| JP | 2018082150 | A | 5/2018 |
| JP | 2019004141 | A | 1/2019 |
| JP | 2020205431 | A | 12/2020 |
| KR | 20010098961 | A | 11/2001 |
| KR | 20070015959 | A | 2/2007 |
| KR | 20160103590 | A | 9/2016 |
| KR | 20180126388 | A | 11/2018 |
| TW | 201634917 | A | 10/2016 |
| TW | 201727770 | A | 8/2017 |
| TW | 201926510 | A | 7/2019 |
| WO | 2019227861 | A1 | 12/2019 |

OTHER PUBLICATIONS

Application No. PCT/US2022/034059 , International Preliminary Report on Patentability, Mailed On Jan. 11, 2024, 7 pages.

EP22833913.1, "Extended European Search Report", Mar. 21, 2025, 8 pages.

\* cited by examiner

500

Form plasma in RPS — 505

Flow plasma effluents into chamber — 510

Perform operation on substrate — 515

Form plasma in remote section of chamber — 520

Perform operation on substrate — 525

SEMICONDUCTOR PROCESSING CHAMBER ADAPTER

TECHNICAL FIELD

The present technology relates to semiconductor systems, processes, and equipment. More specifically, the present technology relates to systems and methods for delivering precursors within a system and chamber.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process or individual material removal. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etch processes may penetrate into intricate features and trenches, but may not provide acceptable top-to-bottom profiles. As device sizes continue to shrink in next-generation devices, the ways in which systems deliver precursors into and through a chamber may have an increasing impact. As uniformity of processing conditions continues to increase in importance, chamber designs and system set-ups may have an important role in the quality of devices produced.

Thus, there is a need for improved systems and methods that can be used to produce high quality devices and structures. These and other needs are addressed by the present technology.

SUMMARY

Exemplary semiconductor processing systems may include a processing chamber. The systems may include a remote plasma unit coupled with the processing chamber. The systems may include an adapter coupled between the remote plasma unit and the processing chamber. The adapter may be characterized by a first end and a second end opposite the first end. The remote plasma unit may be coupled with the adapter at the first end. The adapter may define a first central channel extending more than 50% of a length of the adapter from the first end of the adapter. The adapter may define a second central channel extending less than 50% of the length of the adapter from the second end of the adapter. The adapter may define a transition between the first central channel and the second central channel.

In some embodiments, the transition defined between the first central channel and the second central channel of the adapter may include a plurality of apertures defined by the adapter and fluidly coupling the first central channel with the second central channel. Each aperture of the plurality of apertures may be characterized by a cross-sectional diameter of less than or about 10 mm. The first central channel and the second central channel may be characterized by a similar cross-sectional diameter. The second central channel may extend less than 10% of the length of the adapter from the second end of the adapter. The adapter may be coupled to electrical ground. The adapter may define a recessed ledge between the first end and the second end. The semiconductor processing system may include a system housing seated on the recessed ledge of the adapter. The system housing may be grounded. The systems may include an isolator coupled with the second end of the adapter. The isolator may be or include a ceramic. The systems may include a mixing manifold coupled between the isolator and the processing chamber. The mixing manifold may be characterized by a first end and a second end opposite the first end. The mixing manifold may be coupled with the processing chamber at the second end. The mixing manifold may define a central channel through the mixing manifold. The mixing manifold may be electrically coupled with an RF power supply.

Some embodiments of the present technology may encompass semiconductor processing systems. The systems may include a remote plasma unit. The systems may include a processing chamber. The chamber may include a gasbox defining a central channel. The chamber may include a faceplate coupled with the gasbox at a first surface of the faceplate. The chamber may include a spacer coupled with the faceplate at a second surface of the faceplate opposite the first surface of the faceplate. The chamber may include a showerhead coupled between the spacer and a processing region of the processing chamber. The systems may include an adapter coupled between the remote plasma unit and the processing chamber. The adapter may be characterized by a first end and a second end opposite the first end. The remote plasma unit may be coupled with the adapter at the first end. The adapter may define a first central channel extending more than 50% of a length of the adapter from the first end of the adapter. The adapter may define a second central channel extending less than 50% of the length of the adapter from the second end of the adapter. The adapter may define a transition between the first central channel and the second central channel.

In some embodiments, the systems may include a mixing manifold seated on the gasbox. The adapter may be coupled between the mixing manifold and the remote plasma unit. The gasbox, the faceplate, and the mixing manifold may be electrically coupled with an RF power source. The adapter may be coupled to electrical ground. The showerhead may be coupled to electrical ground. A plasma region may be defined between the showerhead and the faceplate. The transition defined between the first central channel and the second central channel of the adapter may include a plurality of apertures defined by the adapter and fluidly coupling the first central channel with the second central channel. The adapter may define a recessed ledge between the first end and the second end. The semiconductor processing system may include a system housing seated on the recessed ledge of the adapter. The system housing may be grounded.

Some embodiments of the present technology may encompass semiconductor processing systems. The systems may include a remote plasma unit. The systems may include a processing chamber. The processing chamber may include a gasbox defining a central channel. The processing chamber may include a faceplate coupled with the gasbox at a first surface of the faceplate. The gasbox and the faceplate may be coupled with an RF power supply. The chambers may include a spacer coupled with the faceplate at a second surface of the faceplate opposite the first surface of the faceplate. The chambers may include a showerhead coupled between the spacer and a processing region of the processing chamber. The showerhead may be coupled to electrical ground. The systems may include an adapter coupled between the remote plasma unit and the processing chamber. The adapter may be characterized by a first end and a second end opposite the first end. The remote plasma unit may be coupled with the adapter at the first end. The adapter may define a first central channel extending more than 50% of a length of the adapter from the first end of the adapter. The adapter may define a second central channel extending less than 50% of the length of the adapter from the second end of the adapter. The adapter may define a transition between the first central channel and the second central channel. The adapter may be coupled to electrical ground. In some embodiments, the adapter may define a recessed ledge between the first end and the second end. The semiconductor processing systems may include a system housing seated on the recessed ledge of the adapter. The system housing may be grounded.

Such technology may provide numerous benefits over conventional systems and techniques. For example, the present technology may utilize a limited number of components compared to conventional designs. Additionally, by configuring the chamber components for a multiple-plasma system, parasitic or stray plasma may be controlled or prevented. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
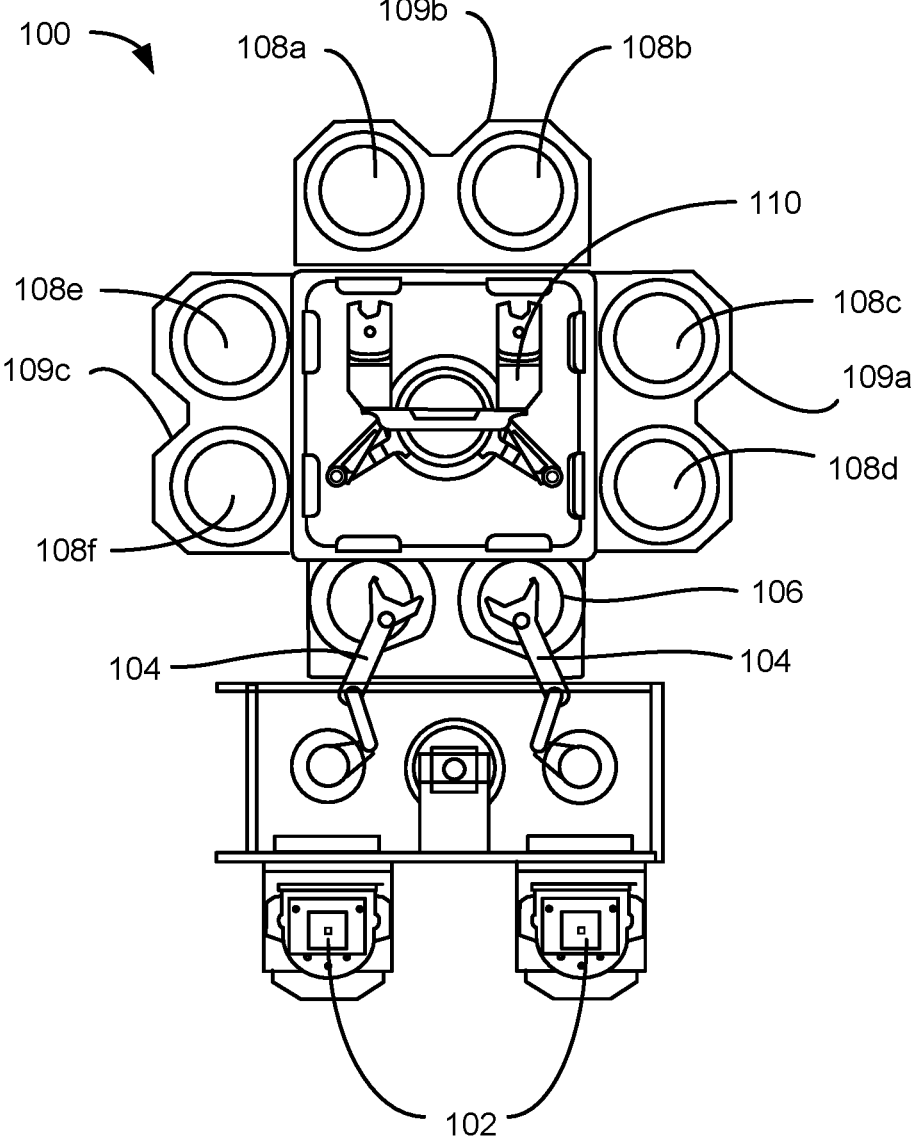
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes semiconductor processing systems, chambers, and components for performing semiconductor fabrication operations. Many dry etch operations performed during semiconductor fabrication may involve multiple precursors. When energized and combined in various ways, these etchants may be delivered to a substrate to remove or modify aspects of the substrate. Traditional processing systems may provide precursors, such as for deposition or etching, in multiple ways. One way of providing enhanced precursors is to provide all of the precursors through a remote plasma unit before delivering the precursors through a processing chamber and to a substrate, such as a wafer, for processing. An issue with this process, however, is that the power at which a plasma is ignited may affect the process being performed by the amount of dissociation produced. For example, in some processes a high amount of dissociation for a hydrogen-containing precursor may be beneficial, but a lower amount of dissociation for a fluorine-containing precursor may allow a more controlled etch. Additionally, because of the amount of travel between a remote plasma unit and the substrate, recombination may be an increased challenge.

Traditional processing may also deliver one precursor through a remote plasma device for plasma processing, and may deliver a second precursor directly into a chamber. An issue with this process, however, is that mixing of the precursors may be difficult, may not provide adequate control over etchant generation, and may not provide a uniform etchant at the wafer or substrate. This may cause processes to not be performed uniformly across a surface of a substrate, which may cause device issues as patterning and formation continues.

An additional process for plasma formation may involve producing a capacitively-coupled plasma within the chamber, such as in a remote region within the chamber, or within the processing volume. A wafer-level plasma may bombard delicate features, and affect chemical etching. Producing a remote plasma within the processing volume may provide a number of benefits. For example, a lower-power plasma may be generated to control ionization, and because the generation is nearer the substrate to be processed, recombination due to travel distance may be less of a challenge. Additionally, plasma species may be distributed radially outward more uniformly than delivery from a remote plasma unit, which may deliver precursors through a centrally located tube. However, producing the plasma within the chamber where certain lid stack components may be grounded, while others may be coupled with a power supply, may increase parasitic plasma formation. As an example discussed further below, because an RPS unit may be operated at lower power frequency than an internal capacitively-coupled plasma, the RPS unit may effectively operate as a ground, which may cause plasma generation upstream of the remote location within the chamber, and which may detrimentally damage components, as well as impact etch uniformity.

The present technology may overcome these issues by utilizing components and systems configured to limit or prevent plasma generation outside of desired locations, while providing a chamber configured to provide multiple plasma generation capabilities for increased system flexibility. Systems of the present technology may also include component configurations that control electrical coupling between components, affording multiple plasma generation capabilities.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes or chambers alone. The disclosure will discuss one possible system and chamber that can be used with the present technology before describing component aspects and variations to this system according to embodiments of the present technology.

FIG. 1 shows a top plan view of one embodiment of a processing system 100 of deposition, etching, baking, and curing chambers according to embodiments. In the figure, a pair of front opening unified pods (FOUPs) 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2:
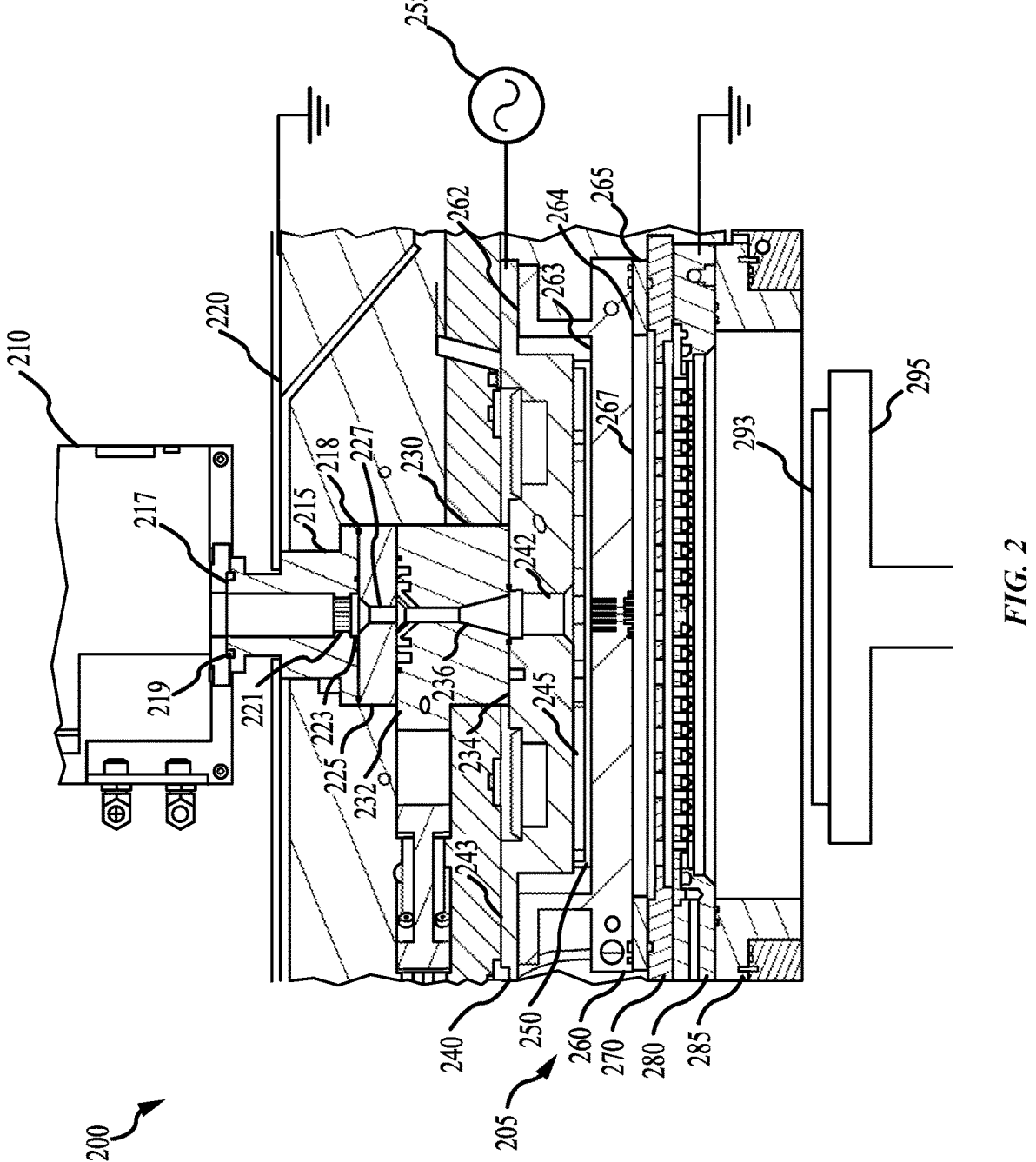
FIG. 2 shows a schematic cross-sectional view of an exemplary processing chamber according to some embodiments of the present technology.

FIG. 2 shows a schematic cross-sectional view of an exemplary processing system 200 according to embodiments of the present technology. System 200 may include a processing chamber 205 and a remote plasma system ("RPS") unit 210, which is shown partially. The remote plasma unit 210 may be coupled with processing chamber 205 with one or more components. The remote plasma unit 210 may be coupled with one or more of an adapter 215, an isolator 225, and a mixing manifold 230. Mixing manifold 230 may be coupled with a top of processing chamber 205, and may be coupled with an inlet to processing chamber 205.

Adapter 215 may be coupled with the RPS unit in embodiments. Adapter 215 may be characterized by a first end 217 and a second end 218 opposite the first end, where RPS unit 210 is seated on the first end 217 of the adapter 215. Adapter 215 may define one or more central channels through portions of adapter 215. For example, from first end 217, central channel 219, or a first central channel, may extend at least partially through adapter 215 towards second end 218, and may extend through any length of adapter 215. Central channel 219 may extend more than half of a length through adapter 215. As will be explained further below, by configuring adapter 215 with a first central channel extending greater than 50% of a length of the length of the adapter, parasitic plasma formation within the adapter may be limited or prevented.

Adapter 215 may define a base of first central channel 219 within the adapter 215, which may define a transition from central channel 219 to a plurality of apertures 221 that may at least partially extend through adapter 215. The transition may occur at a location below a midpoint through the adapter, such as nearer the second end 218 of the adapter 215. For example, apertures 221 may extend from a base of first central channel 219 towards second end 218 of adapter 215, and may extend to fluidly couple with a second central channel 223. Second central channel 223 may extend from the plurality of apertures 221 to the second end 218 of the adapter 215. Second central channel 223 may extend less than or about 50% of a length of adapter 215 in a direction of flow from the RPS unit, and may extend less than or about 40% of a length of the adapter, less than or about 30% of a length of the adapter, less than or about 20% of a length of the adapter, less than or about 10% of a length of the adapter, or less.

By limiting a length of the second central channel through the adapter, parasitic plasma formation may be limited within the adapter. Similarly, apertures 221 may be characterized by a diameter configured to limit plasma formation within the apertures by a hollow cathode effect. For example, in some embodiments, apertures 221 may be characterized by a cross-sectional diameter of less than or about 50% of a diameter of central channel 219, and may be characterized by a diameter less than or about 40%, less than or about 30%, less than or about 20%, less than or about 10%, less than or about 5%, or less of the diameter of central channel 219. Second central channel 223 may be characterized by a similar cross-sectional diameter as the first central channel 219 in some embodiments, although the diameter may be greater than or less than the diameter of first central channel 219 in some embodiments.

Based on plasma powers utilized in the processing system, apertures 221 may be characterized by a cross-sectional diameter of less than or about 10 mm, and may be characterized by a cross-sectional diameter of less than or about 9 mm, less than or about 8 mm, less than or about 7 mm, less than or about 6 mm, less than or about 5 mm, less than or about 4 mm, or less. This may limit or prevent plasma generation within the apertures, which may control plasma formation upstream of the mixing manifold 230 in some embodiments. Adapter 215 may also define a ledge as will be described further below, and on which a system cover or housing 220 may be seated, as shown. The housing may be coupled with electrical ground as shown, and thus, adapter 215 may be coupled with electrical ground in some embodiments of the present technology.

Adapter 215 may be made of a ceramic or insulative material, although in some embodiments, adapter 215 may be made of or include aluminum, including oxides of aluminum, treated aluminum on one or more surfaces, or some other material, such as nickel, or nickel-plated aluminum. For example, interior surfaces of adapter 215 may be coated with one or more materials to protect adapter 215 from damage that may be caused by plasma effluents from remote plasma unit 210. Interior surfaces of adapter 215 may be anodized with a range of materials that may be inert to plasma effluents of fluorine, for example, and which may include yttrium oxide or barium titanate, for example.

Coupled with adapter 215 may be an isolator 225, which may be coupled with second end 218 of adapter 215. Isolator 225 may be or include a ceramic, and may operate to electrically isolate adapter 215 from mixing manifold 230, which may operate at a different electrical potential than adapter 215 in some embodiments of the present technology. Isolator 225 may define a central aperture 227 through isolator 225. Central aperture 227 may be characterized by a tapered shape through isolator 225 from a portion proximate second central channel 223 of adapter 215 to the opposite side of isolator 225. A portion of central aperture 227 proximate second central channel 223 may be characterized by a diameter equal to or similar to a diameter of second central channel 223. Central aperture 227 may be characterized by a percentage of taper of greater than or about 10% along a length of isolator 225, and may be characterized by a percentage of taper greater than or about 20%, greater than or about 30%, greater than or about 40%, greater than or about 50%, greater than or about 60%, greater than or about 70%, greater than or about 80%, greater than or about 90%, greater than or about 100%, greater than or about 150%, greater than or about 200%, greater than or about 300%, or greater in embodiments.

Mixing manifold 230 may be coupled with isolator 225 at a first end 232 or first surface, and may be coupled with chamber 205 at a second end 234 opposite first end 232. Mixing manifold 230 may define a central channel 236, which may extend from first end 232 to second end 234 and may be configured to deliver precursors into processing chamber 205. Mixing manifold 230 may also be configured to incorporate an additional precursor with the mixed precursors delivered from adapter 215. Mixing manifold 230 may provide a second stage of mixing within the system. Mixing manifold 230 may define a port along an exterior of mixing manifold 230, such as along a side or sidewall of mixing manifold 230. Mixing manifold 230 may also define one or more trenches within first surface 232 of mixing manifold 230, which may provide fluid access from a port to central channel 236.

Central channel 236 may be characterized by a first portion extending from first end 232 to a flared section. The first portion of central channel 236 may be characterized by a cylindrical profile, and may be characterized by a diameter similar to or greater than an outlet of central aperture 227 of isolator 225. The flared section may be characterized by a percentage of flare of greater than or about 10%, greater than or about 20%, greater than or about 30%, greater than or about 40%, greater than or about 50%, greater than or about 60%, greater than or about 70%, greater than or about 80%, greater than or about 90%, greater than or about 100%, greater than or about 150%, greater than or about 200%, greater than or about 300%, or greater in embodiments. Mixing manifold 230 may be made of a similar or different material than adapter 215 in embodiments. For example, mixing manifold 230 may include nickel, which may provide adequate protection against the precursors that may all contact portions of the mixing manifold. Unlike conventional technology, because fluorine plasma effluents may already be mixed upstream of the mixing manifold, issues related to recombination may not occur. For example, without wishing to be bound by any particular theory, nickel may catalyze the recombination of fluorine radicals into diatomic fluorine, which may contribute to material losses on the substrate in conventional technologies. When the fluorine effluents are mixed prior to delivery into a nickel, nickel plated, or coated component, this process may be limited as the concentration of fluorine effluents may be reduced, further protecting features at the substrate level.

Chamber 205 may include a number of components in a stacked arrangement. The chamber stack may include a gasbox 240, a blocker plate 250, a faceplate 260, a spacer 265, an optional ion suppression element 270, a showerhead 280, and a lid spacer 285. The components may be utilized to distribute a precursor or set of precursors through the chamber to provide a uniform delivery of etchants or other precursors to a substrate 293 for processing. Substrate 293 may be seated on a pedestal 295, which may be raised or lowered in different embodiments during operation or for particular operations. In embodiments, these distribution components may be stacked plates each at least partially defining an exterior of chamber 205.

Gasbox 240 may define a chamber inlet coupled with the mixing manifold 230. A central channel 242 may be defined through gasbox 240 to deliver precursors into chamber 205. The inlet of the gasbox may be sized to be aligned with the outlet of mixing manifold 230. For example, the inlet and/or central channel 242 may be characterized by a similar or greater diameter than the outlet of the mixing manifold in embodiments. Central channel 242 may extend through gasbox 240 and be configured to deliver one or more precursors into an interior volume of the processing chamber. Gasbox 240 may include or be characterized by a first surface 243, such as a top surface, and a second surface 245 opposite the first surface 243, such as a bottom surface of gasbox 240. Coupled with top surface 243 may be a heater or weldment defining a channel for receiving a cooled fluid for temperature control.

Second surface 245 of gasbox 240 may be coupled with blocker plate 250, which may be attached or coupled with the gasbox, for example. Blocker plate 250 may be characterized by a diameter equal to or similar to a diameter of a protruding portion of gasbox 240. Blocker plate 250 may define a plurality of apertures through blocker plate 250, only a sample of which are illustrated, and which may allow distribution of precursors, such as etchants, from the central channel 242 of the gasbox, and may begin distributing precursors through chamber 205 for a uniform delivery to a substrate. Faceplate 260 may include a first surface 262 and a second surface 264 opposite the first surface 262. Faceplate 260 may be coupled with gasbox 240 at first surface 262, which may engage an outer annular section of the gasbox. Faceplate 260 may define a recess 263 at an interior of first surface 262, which may define a volume in which blocker plate 250 may be disposed, and within which gasbox 240 and the central channel 242 may extend.

The blocker plate may remain a distance from the faceplate to allow further distribution subsequent to precursors being distributed through the blocker plate. In some embodiments, one or more of the gasbox, blocker plate, and faceplate components, along with the mixing manifold, may be in direct physical and electrical contact. The components may be coupled electrically with a power supply, such as RF power supply 255, which may provide power to the components for generating a plasma within a region defined between the faceplate and other downstream components. To produce a capacitively-coupled plasma between the faceplate and one or more other components, a spacer 265 may be disposed between the faceplate and other components, which may electrically isolate the faceplate from the other components. Accordingly, spacer 265 may be a dielectric component, such as a ceramic or other insulating material in some embodiments of the present technology.

Ion suppression element 270 may be positioned proximate the second surface 264 of faceplate 260, and may be coupled on an opposite side of the spacer 265. With faceplate 260, and radially defined by spacer 265, ion suppression element 270 may define a remote plasma region 267 within the processing chamber. The region may be termed remote from the perspective that the substrate to be processed may not be directly exposed to plasma effluents generated in plasma region 267. In this way, plasma bombardment of the wafer may be limited or prevented. Additionally, ion suppression element 270 may be configured to reduce ionic migration into the processing region of chamber 205 housing a substrate. Ion suppression element 270 may define a plurality of apertures through the structure. Showerhead 280 may be disposed adjacent ion suppression element 270, and the ion suppression element may be seated on the showerhead 280. Although any perforated plate or manifold may be included in embodiments of the present technology, in some embodiments showerhead 280 may be a dual-channel showerhead as illustrated. The showerhead may include two plates coupled together to define a central volume in which a separate precursor may be flowed, such as from an external port or channel. The lower plate, such as facing the processing region, may define apertures providing fluid access from the volume, although the top plate may prevent access upstream from the upper plate. The upper plate and lower plate may also define axially aligned holes to produce channels extending through the showerhead. In this way, the showerhead may allow precursors to be delivered from upstream through the showerhead, and the precursors may not interact with precursors delivered through the internal volume defined by the showerhead until each of the precursors exit the lower plate of the showerhead into the processing region.

The showerhead 280 may be seated on a lid spacer 285, which may at least partially define a processing region in which substrate 293 may be disposed for semiconductor processing. Lid spacer 286 may be an insulating or dielectric material in some embodiments, although in embodiments the component may also be conductive. In some embodiments, one or more of the ion suppression element 270, the showerhead 280, and the lid spacer 285 components may be in direct physical and electrical contact. The components may be coupled electrically to electrical ground, which may control the internal plasma formation, and which may limit the formation to remote plasma region 267 between faceplate 260, which may be electrically powered, and ion suppression element 270, which may be grounded. Accordingly, system 200 may include both an RPS unit for remote plasma generation, as well as a region internal to the chamber in which plasma generation may also be performed.

As noted above, mixing manifold 230 may be electrically coupled with the gasbox 240 and other components of the powered electrode. However, adapter 215 may be grounded. In some conventional setups, such a configuration may allow plasma to generate upstream of the gasbox during operation of the powered electrode. This may damage components, and may impact the plasma formation in the remote plasma region 267, which may reduce etching and uniformity of processing on the substrate. Additionally, RPS units may often be operated at lower frequency than capacitively coupled plasma power supplies, which can cause back streaming plasma to enter and damage the RPS unit. For example, while power supply 255 may be operated at any number of higher frequencies, such as 13.56 MHz in one non-limiting example, the RPS unit may be operated at lower frequency, such as a few hundred kilohertz or less. In conventional setups that may not include additional grounding as discussed here, the RPS unit may effectively operate as an additional ground path for the powered electrode due to the discrepancy in frequency of operation. Plasma may then be generated upstream and into the RPS unit, which may damage components. However, the present technology may limit or prevent these effects by the configuration and coupling of the components upstream of the gasbox. By utilizing components according to configurations of embodiments of the present technology, the adapter may be grounded to prevent plasma intrusion to the RPS unit, and the components may be configured to limit or prevent plasma generation.

Figure 3:
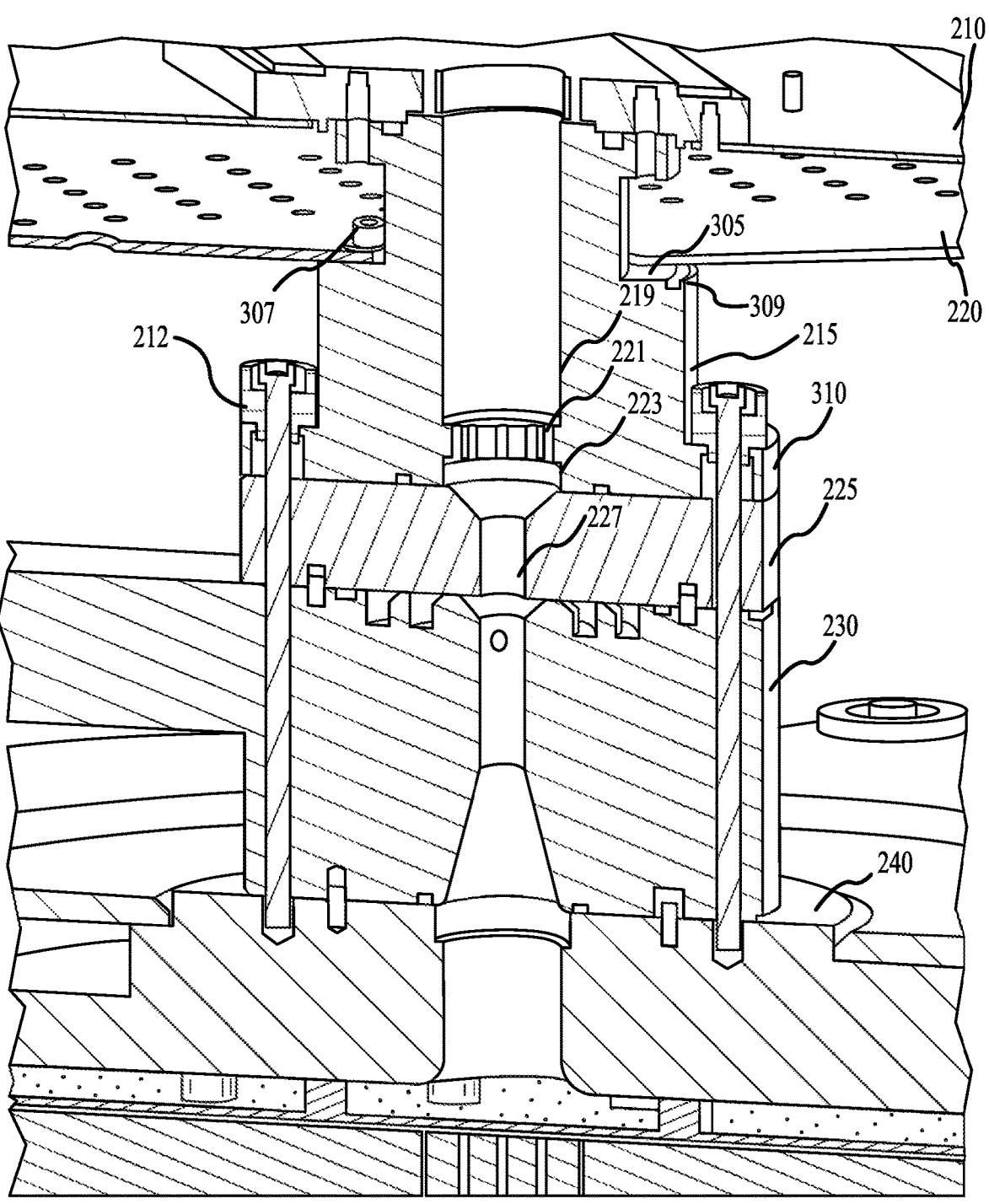
FIG. 3 shows a cross-sectional view of a portion of an exemplary processing chamber according to some embodiments of the present technology.

FIG. 3 shows a cross-sectional view of a portion of exemplary processing system 200 according to some embodiments of the present technology. The figure may illustrate additional aspects of the components discussed previously, and may include any feature, aspect, or characteristic of any component described above. As discussed previously, RPS unit 210 may be seated on a first end of adapter 215, and adapter 215 may be coupled with isolator 225 at a second end of the adapter. Adapter 215 may also define a ledge 305 between the first end of the adapter, which may include a mating flange for the RPS unit as illustrated, and the second end of the adapter, which may include a mating flange for the underlying components as will be discussed below. Ledge 305 may be a recessed ledge from an outer diameter of the adapter, and may be located a distance along a length of the adapter, which may be along a portion through which the first central channel 219 is defined.

System housing 220 may be seated on ledge 305 as illustrated, and may be coupled with the adapter. As explained previously, the system housing may be grounded, which when coupled with the adapter 215 may electrically ground the adapter. This may limit or prevent plasma from generating in the RPS unit based on operation of a downstream electrode. The system housing may be directly coupled with adapter 215, such as with a connector 307 as illustrated. This may ensure the components remain in contact. Connector 307 may be any type of coupling, including a bolt, which may be seated in a bushing as illustrated, although it is to be understood that any coupler or fastener may be used to maintain physical contact between the components. To maintain symmetry for the electrical coupling, in some embodiments, a channel 309 may be defined about the ledge 305. An RF strap or other conductive material may be seated within the channel, and which may provide contact with the housing and along the adapter.

A flange 310 may be defined at the second end of the adapter 215, and may define one or more apertures to allow coupling with additional components. As illustrated, adapter 215 may be coupled with gasbox 240, along with isolator 225 and mixing manifold 230. Elastomeric elements or o-rings may be disposed between the components to fluidly seal the components during operation. However, as explained previously, adapter 215 may be grounded, while mixing manifold 230 and gasbox 240 may be coupled with a power supply to operate as a powered electrode for plasma generation. To limit shorting, in some embodiments of the present technology, the connecting components used for coupling the system components may be electrically isolated from the adapter 215. As illustrated, one or more apertures may be defined in each of the components to receive bolts, fasteners, or any other coupling component. However, a bushing 212 may be seated and recessed as illustrated in each aperture of the adapter 215, which may limit or prevent contact or electrical coupling between the bolts and the grounded adapter. Additionally, the apertures defined through the adapter may be characterized by a diameter that may be at least double or more the diameter of the coupling component, which may limit electrical shorting between the materials. In some embodiments the bushing 212 may extend fully through the apertures in the adapter, and may seat at or within the isolator.

As noted above, because of the grounded adapter, plasma generation upstream of the powered mixing manifold may be a challenge for conventional technology. However, the present technology may include an adapter configured to limit production of plasma within the component. For example, as explained previously, the second central channel 223 may extend less than or about 50% of a length of adapter 215 in a direction of flow from the RPS unit, and may extend less than or about 20% of a length of the adapter, less than or about 10% of a length of the adapter, or less, which may control available space for plasma generation. For example, the length of the second section may be maintained at less than or about 5 cm, and may be maintained at less than or about 4 cm, less than or about 3 cm, less than or about 2 cm, less than or about 1 cm, less than or about 9 mm, less than or about 8 mm, less than or about 7 mm, less than or about 6 mm, less than or about 5 mm, less than or about 4 mm, less than or about 3 mm, less than or about 2 mm, or less, where the chamber may be operated at a few dozen Torr or less pressure.

When conventional technologies utilize adapters with an increased distance for the component in this electrical configuration, the region may provide a hollow cathode effect, which may increase current density within the area. This can lead to increased ionization that can develop plasma generation within the component. The present technology may limit the distance to any of the ranges above, which may limit or prevent plasma generation during operation of the active capacitively-coupled electrode. By reducing the spacing, a mean-free path length may be controlled before collision with the transition section, and which may prevent ionization in the component. Similarly, the apertures 221 defined at the transition between the first central channel 219 and the second central channel 223 may be sized to prevent a hollow cathode effect, and may be sized at any of the ranges listed above, such as less than or about 10 mm, less than or about 9 mm, less than or about 8 mm, less than or about 7 mm, less than or about 6 mm, less than or about 5 mm, less than or about 4 mm, less than or about 3 mm, or less, in some embodiments of the present technology.

Figure 4:
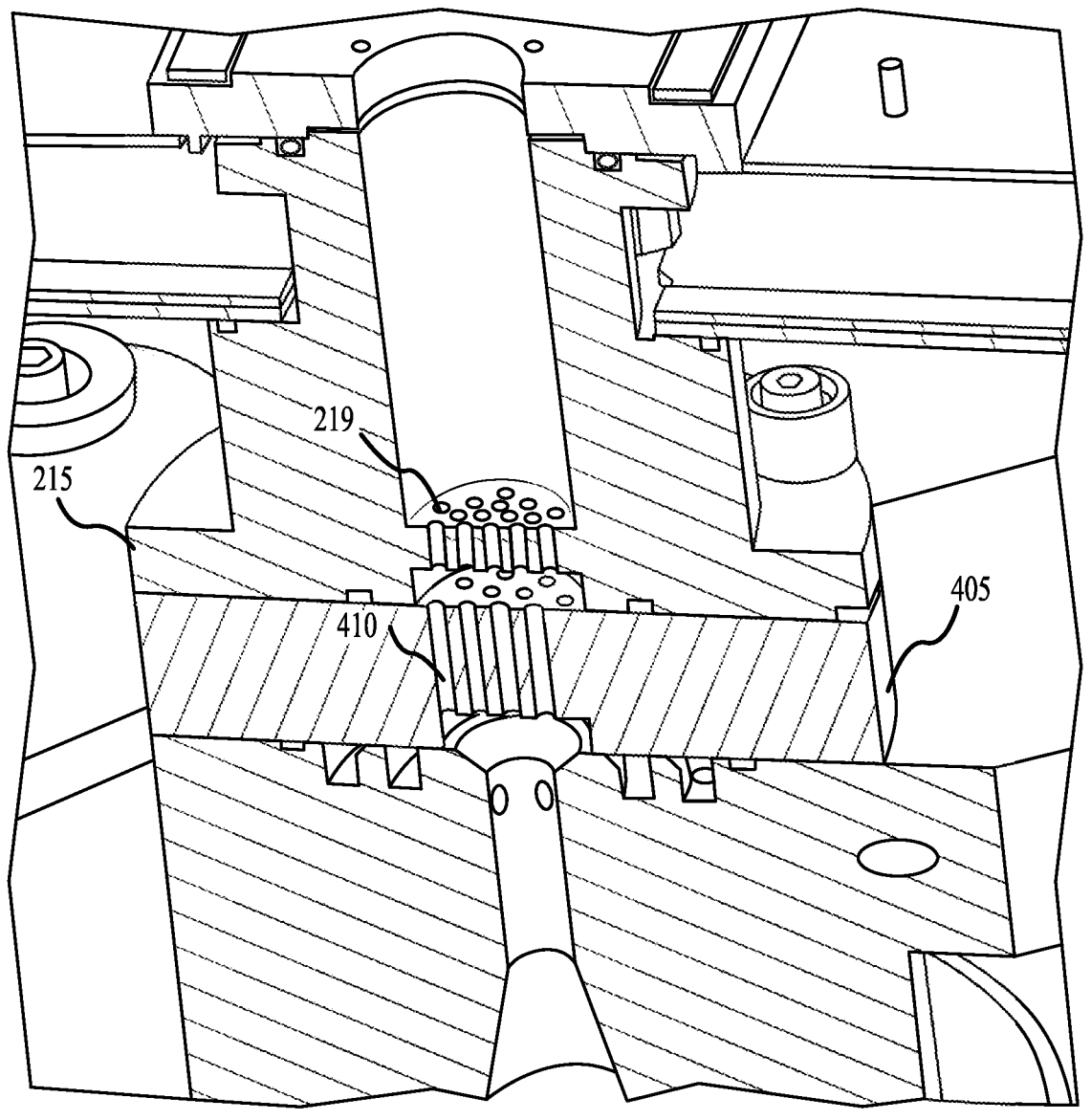
FIG. 4 shows a cross-sectional view of a portion of an exemplary processing chamber according to some embodiments of the present technology.

Central aperture 227 of isolator 225 may also affect a likelihood of plasma generation within the space defined by the central aperture, which may produce a volume between the electrically powered mixing manifold and the grounded adapter. Accordingly, depending on the power being supplied and the pressure at which the chamber may be operated, in some embodiments the central aperture 227 may be modified to a plurality of apertures. FIG. 4 shows a cross-sectional view of a portion of exemplary processing system 200 according to some embodiments of the present technology. The figure may illustrate additional aspects of the components discussed previously, and may include any feature, aspect, or characteristic of any component described above. The figure may illustrate an additional isolator configuration according to some embodiments of the present technology.

Isolator 405 may include any feature, aspect, or characteristic of isolator 225 as discussed above, and may include a plurality of channels 410 instead of a central aperture as previously described. Because the insulative isolator defines space between capacitively-coupled electrodes, plasma generation may develop in a volume defined by the isolator. Although the diameter of a single, centrally defined aperture may be reduced in some embodiments, depending on the operational parameters of the chamber, such as the pressure and plasma electrode power, plasma generation may not be prevented while maintaining adequate flow through the component. By including a plurality of channels 410, sufficient flow may be maintained through the isolator, while plasma generation may be prevented. For example, the apertures may be maintained at any of the diameters noted above for the aperture 221 defined at the transition in the adapter. Additionally, as illustrated, the channels 410 may be laterally offset from a central axis through any aperture 221 at the transition in the adapter. Accordingly, in some embodiments, no channel 410 may be axially aligned with any aperture 221 of the adapter. This again may limit a mean-free path length in any direction before collision, which may prevent plasma generation between the mixing manifold and the adapter. By utilizing components and configurations according to embodiments of the present technology, an RPS unit and a capacitively-coupled plasma may be utilized for more operational flexibility over conventional systems.

Figure 5:
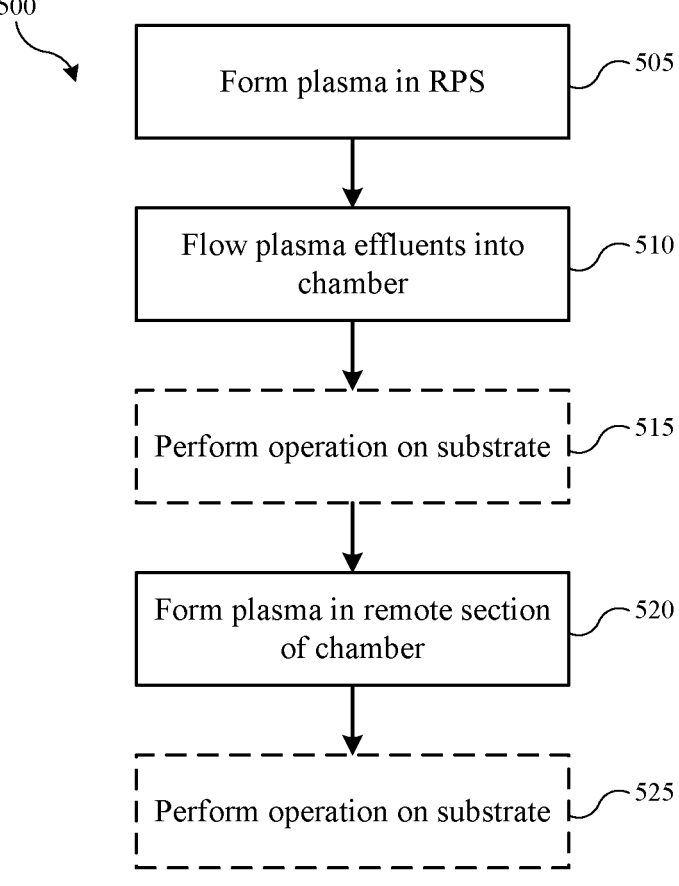
FIG. 5 shows operations of a method of delivering precursors through a processing system according to some embodiments of the present technology.

FIG. 5 shows operations of a method 500 of performing operations in systems according to some embodiments of the present technology. Method 500 may be performed in system 200, and may allow improved processing flexibility, while protecting components from etchant damage, and limiting upstream plasma generation during capacitively-coupled plasma formation. Method 500 may include any number of operations for plasma processing, and may describe operations that may be performed in exemplary systems, although the operations may be performed in different orders, and for any number of processes. Although an etch process is being described, it is to be understood that the processing may similarly encompass cleaning or deposition operations as well.

Method 500 may include forming a plasma in an RPS unit at optional operation 505. The plasma effluents may be flowed into a processing chamber at operation 510. The plasma effluents may be flowed through any of the components included between the RPS unit and the chamber, and in some embodiments, additional precursors may be flowed into one or more of the components, such as through a mixing manifold, for example, to be mixed with the plasma effluents. At optional operation 515, the plasma effluents and materials may flow through the chamber to perform an operation within the chamber or to a substrate disposed within the processing region of the chamber.

Method 500 may also include forming a plasma within the processing chamber at operation 520, such as between a faceplate and ion suppression element, for example, as previously explained. In some embodiments the plasma may be contained within a remote plasma region defined within the processing chamber, and plasma may be limited or prevented from forming upstream from the remote region, such as within an isolator or adapter as previously described. At optional operation 525, plasma effluents may be flowed into the processing region and may act on the processing chamber or a substrate disposed within the processing region. By utilizing components and chamber configurations as previously described, improved plasma uniformity and processing precision may be provided.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing system comprising:
a processing chamber;
a system housing coupled to electrical ground;
a remote plasma unit coupled with the processing chamber; and
an adapter coupled between the remote plasma unit and the processing chamber, wherein:
  the adapter is characterized by an upper end and a lower end opposite the upper end, wherein the remote plasma unit is coupled with the adapter at the upper end;
  the adapter defines a first central channel extending more than 50% of a length of the adapter from the upper end of the adapter;
  the adapter defines a second central channel extending less than 50% of the length of the adapter from the lower end of the adapter;
  the adapter defines a transition between the first central channel and the second central channel;
  the upper end of the adapter comprises an upper mating flange upon which the remote plasma unit is seated;
  the lower end of the adapter comprises a lower mating flange;

the adapter defines a recessed ledge between the upper mating flange and the lower mating flange, the recessed ledge having an upper surface; and
  the system housing is seated on the upper surface of the recessed ledge, electrically grounding the adapter.

2. The semiconductor processing system of claim 1, wherein the transition defined between the first central channel and the second central channel of the adapter comprises a plurality of apertures defined by the adapter and fluidly coupling the first central channel with the second central channel.

3. The semiconductor processing system of claim 2, wherein each aperture of the plurality of apertures is characterized by a cross-sectional diameter of less than or about 10 mm.

4. The semiconductor processing system of claim 1, wherein the first central channel and the second central channel are characterized by a similar cross-sectional diameter.

5. The semiconductor processing system of claim 1, wherein the second central channel extends less than 10% of the length of the adapter from the lower end of the adapter.

6. The semiconductor processing system of claim 1, wherein the adapter is directly coupled to the system housing via a connector.

7. The semiconductor processing system of claim 1, further comprising an isolator directly coupled with the lower end of the adapter, wherein the isolator comprises a plurality of channels.

8. The semiconductor processing system of claim 7, wherein the isolator comprises a ceramic.

9. The semiconductor processing system of claim 7, further comprising a mixing manifold coupled between the isolator and the processing chamber.

10. The semiconductor processing system of claim 9, wherein the mixing manifold is characterized by a first end and a second end opposite the first end, wherein the mixing manifold is coupled with the processing chamber at the second end, wherein the mixing manifold defines a central channel through the mixing manifold.

11. The semiconductor processing system of claim 10, wherein the mixing manifold is electrically coupled with an RF power supply.

12. The semiconductor processing system of claim 1, wherein the recessed ledge is recessed from an outer diameter of the adapter.

13. The semiconductor processing system of claim 1, wherein the recessed ledge is defined around the first central channel and is orthogonal to the length of the first central channel.

14. A semiconductor processing system comprising:
a remote plasma unit;
a system housing coupled to electrical ground;
a processing chamber comprising:
  a gasbox defining a central channel,
  a faceplate coupled with the gasbox at a first surface of the faceplate,
  a spacer coupled with the faceplate at a second surface of the faceplate opposite the first surface of the faceplate, and
  a showerhead coupled between the spacer and a processing region of the processing chamber; and
an adapter coupled between the remote plasma unit and the processing chamber, wherein:
  the adapter is characterized by an upper end and a lower end opposite the upper end; the remote plasma unit is coupled with the adapter at the upper end;

the adapter defines a first central channel extending more than 50% of a length of the adapter from the upper end of the adapter;

the adapter defines a second central channel extending less than 50% of the length of the adapter from the lower end of the adapter;

the adapter defines a transition between the first central channel and the second central channel;

the adapter defines a recessed ledge that is disposed between and spaced apart from the upper end and the lower end, the recessed ledge having an upper surface; and the system housing is seated on the upper surface of the recessed ledge, electrically grounding the adapter.

15. The semiconductor processing system of claim 14, further comprising a mixing manifold seated on the gasbox, wherein the adapter is coupled between the mixing manifold and the remote plasma unit.

16. The semiconductor processing system of claim 15, wherein the gasbox, the faceplate, and the mixing manifold are electrically coupled with an RF power source.

17. The semiconductor processing system of claim 14, wherein the showerhead is coupled to electrical ground, and wherein a plasma region is defined between the showerhead and the faceplate.

18. The semiconductor processing system of claim 14, wherein the transition defined between the first central channel and the second central channel of the adapter comprises a plurality of apertures defined by the adapter and fluidly coupling the first central channel with the second central channel.

19. The semiconductor processing system of claim 14, wherein the recessed ledge is recessed from an outer diameter of the adapter.

20. A semiconductor processing system comprising:

a remote plasma unit;

a system housing coupled to electrical ground;

a processing chamber comprising:

a gasbox defining a central channel, a faceplate coupled with the gasbox at a first surface of the faceplate, wherein the gasbox and the faceplate are coupled with an RF power supply, a spacer coupled with the faceplate at a second surface of the faceplate opposite the first surface of the faceplate, and a showerhead coupled between the spacer and a processing region of the processing chamber, wherein the showerhead is coupled to electrical ground; and an adapter coupled between the remote plasma unit and the processing chamber, wherein:

the adapter is characterized by an upper end and a lower end opposite the upper end;

the remote plasma unit is coupled with the adapter at the upper end;

the adapter defines a first central channel extending more than 50% of a length of the adapter from the upper end of the adapter;

the adapter defines a second central channel extending less than 50% of the length of the adapter from the lower end of the adapter;

the adapter defines a transition between the first central channel and the second central channel;

the adapter defines a recessed ledge that is disposed between and spaced apart from the upper end and the lower end, the recessed ledge having an upper surface; and the system housing is seated on the upper surface of the recessed ledge, electrically grounding the adapter.

\* \* \* \* \*